(12) United States Patent
Brown

(10) Patent No.: US 7,269,813 B2
(45) Date of Patent: Sep. 11, 2007

(54) OFF-WIDTH PITCH FOR IMPROVED CIRCUIT CARD ROUTING

(75) Inventor: Paul Brown, Wakefield (CA)

(73) Assignee: Alcatel, Paris (FR)

( * ) Notice: Subject to any disclaimer, the term of this patent is extended or adjusted under 35 U.S.C. 154(b) by 334 days.

(21) Appl. No.: 10/991,360

(22) Filed: Nov. 19, 2004

(65) Prior Publication Data

US 2006/0110848 A1    May 25, 2006

(51) Int. Cl.
*G06F 17/50*   (2006.01)
*H01L 23/48*   (2006.01)

(52) U.S. Cl. .......................... 716/15; 716/10; 716/12; 257/773

(58) Field of Classification Search ...................... None
See application file for complete search history.

(56) References Cited

U.S. PATENT DOCUMENTS

| | | | | | |
|---|---|---|---|---|---|
| 5,844,810 | A | * | 12/1998 | Douglas et al. | 716/21 |
| 6,114,763 | A | * | 9/2000 | Smith | 257/738 |
| 6,160,715 | A | * | 12/2000 | Degani et al. | 361/767 |
| 6,175,158 | B1 | * | 1/2001 | Degani et al. | 257/777 |
| 6,310,398 | B1 | * | 10/2001 | Katz | 257/773 |
| 6,594,811 | B2 | * | 7/2003 | Katz | 716/12 |
| 6,762,489 | B2 | * | 7/2004 | Daves et al. | 257/692 |
| 6,974,722 | B2 | * | 12/2005 | Daves et al. | 438/106 |
| 2003/0183419 | A1 | | 10/2003 | Miller et al. | 174/261 |
| 2004/0164427 | A1 | * | 8/2004 | Seaman et al. | 257/780 |
| 2005/0044517 | A1 | * | 2/2005 | Seaman et al. | 716/8 |

* cited by examiner

Primary Examiner—Leigh M. Garbowski
(74) Attorney, Agent, or Firm—Jim Zegeer

(57) ABSTRACT

Enlarged spacing is provided between rows of vias in a ball grid array (BGA) multilayered printed wiring board land pattern in which the lands in the pattern are connected to the vias by a link connector by rotating, elongating, and/or truncating selected consecutive link connectors and rotating their respective corresponding vias in a row or column or selected consecutive rows or columns to achieve the enlarged spacing between rows or columns of vias in the BGA land pattern. Enhanced spacing between selected grid columns or rows of vias is provided such that some of the grid pitches for the vias are equal to that of the standard BGA and at least some are of a greater grid pitch.

6 Claims, 3 Drawing Sheets

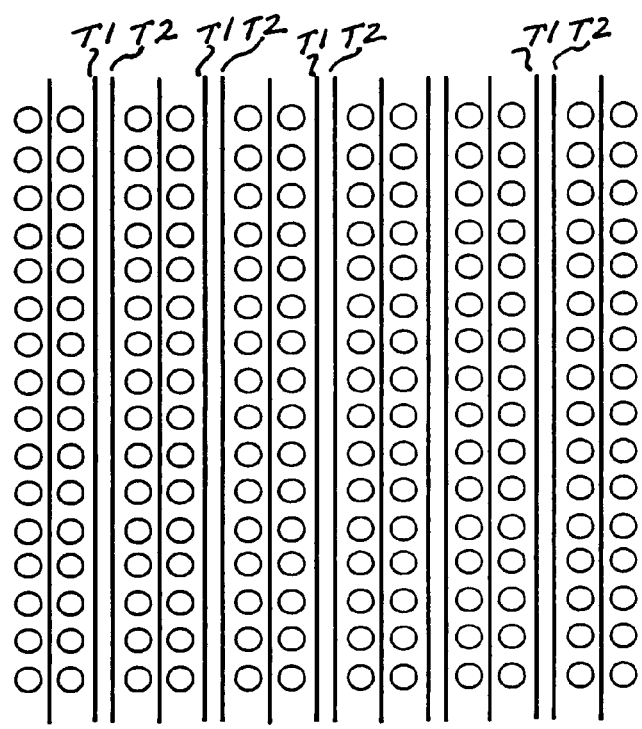
Fig 4
Fig 5
Fig 6
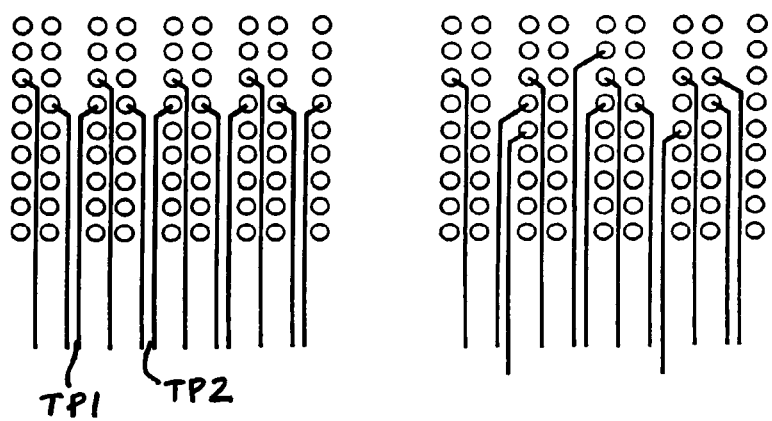

OFF-WIDTH PITCH FOR IMPROVED CIRCUIT CARD ROUTING

FIELD OF THE INVENTION

The present invention relates to the layout of circuit cards and more specifically to routing signal traces within the array of a ball grid array (BGA), e.g. for high density escape, matched delay, or differential signal requirements.

BACKGROUND AND BRIEF DESCRIPTION OF THE INVENTION 1 mm pitch orthogonal BGAs currently represent the workhorse of most high complexity electronic designs. When these designs call for edge coupled differential signal traces to be routed from or through the pin fields of these 1 mm pitch BGA, space constraints and manufacturing limitations conspire to create a very challenging printed circuit board (PCB). When coupled with thicknesses in excess of 0.100" (as is becoming routine), the capability to repeatably fabricate reliable product deteriorates rapidly. Challenges associated with this situation are well known in the industry.

The problem is to provide a method of routing two or more traces through two rows of through-hole (through-board) vias spaced apart at a standard BGA grid pitch (1 mm), using standard circuit card manufacturing techniques for a low-cost/low-risk solution.

Providing higher density routing within a BGA grid has been addressed in the prior art as follows:

1. U.S. application (Publication No. US2003/0183419) Ball Assignment for Ball Grid Array package: discloses sharing vias between rows of adjacent power (or ground) contact pads, thereby allowing vias which would normally be used to be omitted from the grid, which leaves additional room for routing tracks through the grid. A limitation of this technique is that it can be applied to only power and ground contacts, which limits the location and size of the additional routing room created. Another limitation is that it decreases the number of independent path to ground/power, thereby impacting electrical performance.
2. Another technique of increasing the room to route traces between rows of through-hole vias arranged to accommodate a BGA packaged device has been to minimize the via dimensions. This approach involves reducing the via and via pad diameters to allow more room for traces between adjacent vias. However, this alteration increases the via aspect ratio (AR=card thickness/via diameter) and the probability of "breakout" (where the via is not entirely contained within its capture pad as intended). Both of these effects decrease PCB manufacturability and via reliability. (The resulting vias have shown themselves to be more susceptible to failure at solder reflow during assembly because of expansion of high temperature, and to failure in the field due to thermal cycling.)
3. Techniques using composite circuit boards and blind vias can be used to increase the routing density in the BGA grid area, but these are costly approaches that it would be desirable to avoid.

SUMMARY OF THE INVENTION

The invention departs from the regular spacing of through-hole vias that are normally arranged in a grid to be identical to that of BGA contact pads. Accordingly, the invention provides a grid of through-hole vias arranged with the option of variable spacing between columns or rows of the grid. On average, the grid pitch is equal to that of the BGA, while the pitch of individual columns or rows may be greater or lesser than this average. The location of these areas depends on the application specific requirements for routing traces through a grid. The invention incorporates various translation movements of adjacent grid columns or rows of vias and their connector links (sometimes called "dogbones") from their normal regular spacing, to achieve additional trace routing areas between the columns or rows as required. Via link translation is limited by general PCB spacing requirements. By cumulative sequential via translations, the increase in available trace space achievable can become relatively large.

The object of the invention is to provide a low-cost, low-risk method of increasing the trace space available for routing two or more traces in a BGA circuit card. A further object of this invention is to provide a PCB for BGAs having room to route two or more traces through two rows of the through-hole vias normally spaced apart at a standard BGA pitch so that at least one row or one column of vias is off-pitch.

The invention features a method for providing enlarged spacing between rows or columns of vias in a ball grid array (BGA) multilayered printed wiring board land pattern in which the lands in said pattern are connected to said vias by a link connector which comprises rotating, elongating, and/or truncating selected consecutive link connectors and rotating their respective corresponding vias in a row or column or selected consecutive rows or columns to achieve enlarged spacing between rows or columns of vias in said BGA land pattern. The invention further features the method wherein at least two consecutive rows or columns of link connectors and their respective vias are rotated, elongated and/or truncated in mutually opposite directions. Moreover, the rotation and spacing is performed in a manner to achieve a wider circuit trace routing channel between adjacent rows or columns of vias. According to the invention, un-usable fractions of routing channels are transferred to a given channel, such that the cumulative sum of said fractions become a usable additional routing channel. Further, according to the invention, optimization of routability is not restricted to minimizing the number of layers to escape but also includes consideration of selected electrical, thermal and other parameters.

The invention further features a BGA substrate or printed wiring board in which via and link connector pattern has been modified and according to the method described above.

The invention further features a computer aided design (CAD) program for automating the application of the method defined above during layout so as to optimize the resulting routability.

Furthermore, the invention provides a method of providing increased routing of traces through two or more rows of through-hole vias connected to links to orthogonally oriented rows of lands spaced apart in a standard ball grid array (BGA) multilayered printed wiring board grid pitch comprising: providing enhanced spacing between selected grid columns or rows of vias such that some of the grid pitches for said vias are equal to that of the standard BGA and at least some are of a greater grid pitch and wherein said greater grid pitches are achieved by at least two cumulative sequential via and link translations so that the available interlayer trace space achievable becomes relatively large.

BRIEF DESCRIPTION OF THE DRAWINGS

The above and other objects, advantages and features of the invention will become more apparent when considered with the following specification and accompanying drawings wherein:

FIG. 4 shows the end result of applying one of the methods shown in FIGS. 1-3 to a BGA pin field whereby alternating rows of vias are now able to accommodate two lines without compromising PCB manufacturability, FIG. 5 illustrates application of the invention in a situation where a number of transmission pairs must be escaped from a given package as dictated by that specific ICs electrical requirements, FIG. 6 shows the invention being applied to a BGA in a manner to simply increase its routability.

DETAILED DESCRIPTION OF THE INVENTION

The invention addresses the problem of increasing the density of tracks routed through a grid of vias on a multi-layer circuit card, where the vias are arranged to accommodate interconnection requirements of a ball grid array (BGA) packaged device. Specifically, the need for this capability occurs when two or more tracks must be routed between adjacent rows (or columns) of vias in the grid, for example for edge coupled differential signals or simply to allow for localized high density escape. Currently, such routing is not possible on 1 mm pitch BGAs without compromising the via pad and/or via aspect ratio, which in turn can lead to manufacturing and reliability problems. The invention provides localized variances in the via pitch, thereby facilitating the 2 track routing scenario, while maintaining an average pitch that is equal to the pitch of the standard BGA package (e.g. 1 mm).

Figure 1:
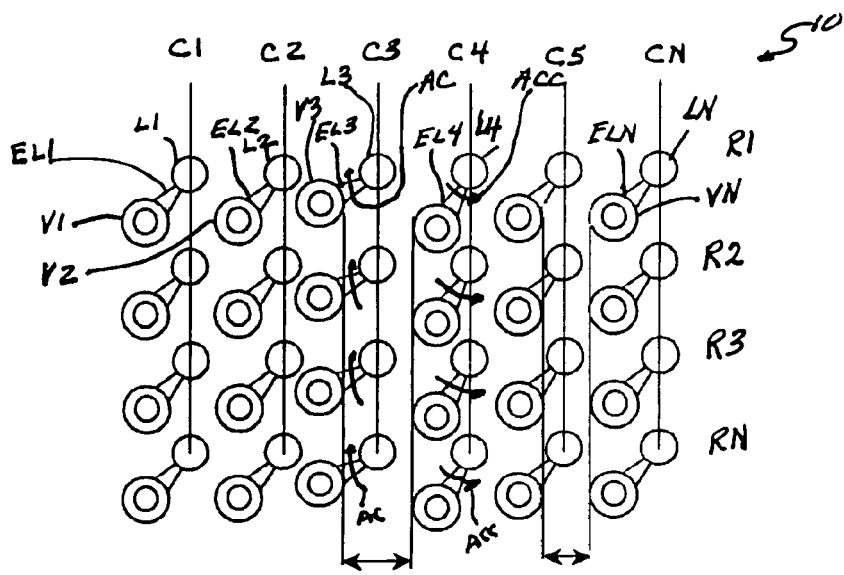
FIGS. 1-3 are the diagrams of three pitch variants (1.4, 1.6 and 2.0) of the invention. The diagrams have been altered to show that while the BGA ball attach pitch remains unchanged (vertical black lines), the routing channel width defined by the via barrels in the central portion of the diagram is wider. (Other variants are possible using different combination of rotation, translation, elongation or truncation.)

Referring to FIG. 1, a multilayered printed circuit board 10 having an array of columns C1, C2, C3, C4 . . . CN and rows R1, R2, R3 . . . RN of contact pads or lands L1, L2, L3, L4 . . . LN which are connected by electrically connector links EL1, EL2, EL2 . . . ELN to a corresponding array of through-hole vias V1, V2, V3, V4 . . . VN. It will be noted that the columns and rows of conductive lands L are in a fixed array determined by the ball contact grid layout of the chip to be affixed to the printed circuit board and through which each chip is to interact with other circuit elements on or off the printed circuit board 10.

Having some of the via pitches being equal to that of the standard BGA is not a requirement to implementing the invention. In fact, it is possible that none of these pitches are equal to a standard BGA (i.e. all are bigger and smaller) as long as on average, the pitch is equal to that of the standard BGA. For example: a BGA that has ten rows and ten columns of balls on a 1 mm pitch. If one-third of these rows or columns are widened to 1.2 mm and the other two-thirds of the rows or columns are narrowed to 0.9 mm, the objective of the invention will have been obtained. None of the rows or columns will be equal to 1 mm, but the resulting average will be exactly 1 mm.

The invention provides a method which achieves variable spacing between rows and/or columns of vias in a BGA land pattern. The connecting links EL (sometimes called the "dogbones" because of their general shape) are translated by rotation, elongation or truncation as will be shown and described in connection with figures as described herein.

Figure 2:
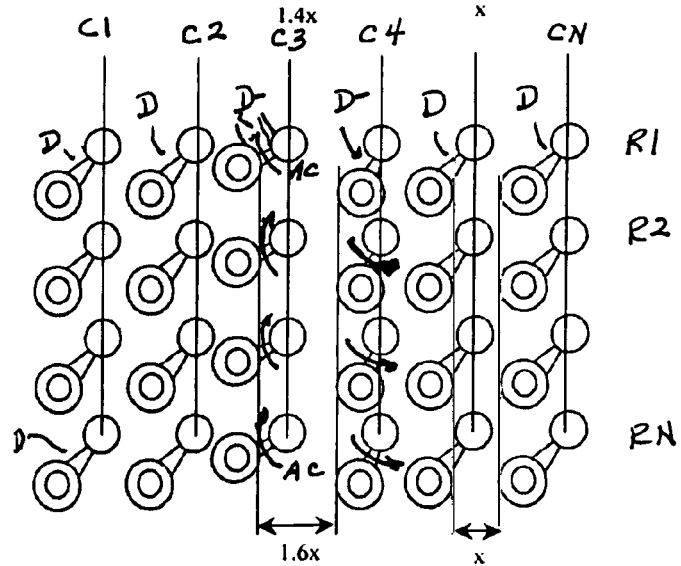
Figure 3:
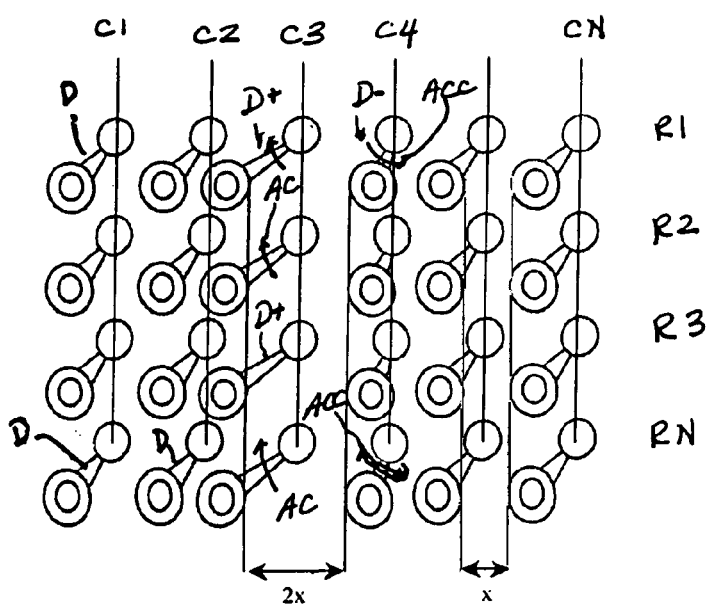

FIG. 1 illustrates how the additional space (1.4×) is achieved by counter-rotation as indicated by the clockwise arrows AC and counter-clockwise arrows ACC of adjacent rows or columns of connector links (dogbones) and their respective vias V. In FIG. 2, a 1.6 channel factor increase is achieved by counter-rotation and truncation (D−) of adjacent columns or rows of adjacent dogbones or connector links EL. In FIG. 3, a two-channel factor is achieved by counter-rotation and simultaneous truncation (D−) and elongation (D+) of adjacent links EL2 or dogbones. In FIG. 3, note that the connector links EL1 have been elongated (D+) and connector links EL4 have been shortened (D−). This achieves simultaneous truncation and elongation of the vias. In each case, the vias remain structurally the same except for their connection and positioning relative to the pads or lands.

While columnar shifts are shown, it is obvious that the methods are equally applicable to row-wise shifts.

FIG. 4 shows the end results of applying one of the invention to a BGA pin field by alternating columns or rows of vias to accommodate two conductive lines T1, T2 or traces without compromising the printed circuit board manufacturability.

Referring now to FIG. 5, the invention is shown in its application to a situation where a number of transmission pairs TP1, TP2 must be escaped from a given package and dictated by that specific integrated circuit electrical requirements. FIG. 6 shows the invention applied to a BGA circuit board in a manner to increase its routability. Note that by definition, the invention allows fifty percent increase in routability without compromising the printed circuit board manufacturability.

Figure 7:
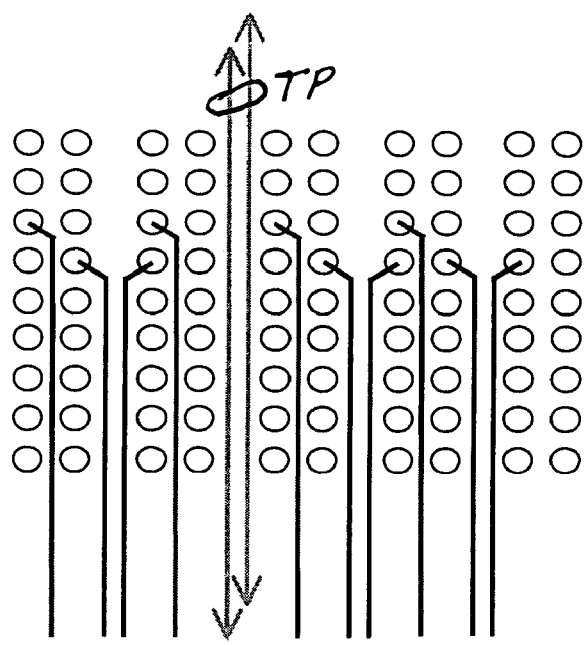
FIG. 7 shows the use of the invention to accommodate the passing of a transmission pair through the BGA pin field from two unassociated ICs.
Figure 8:
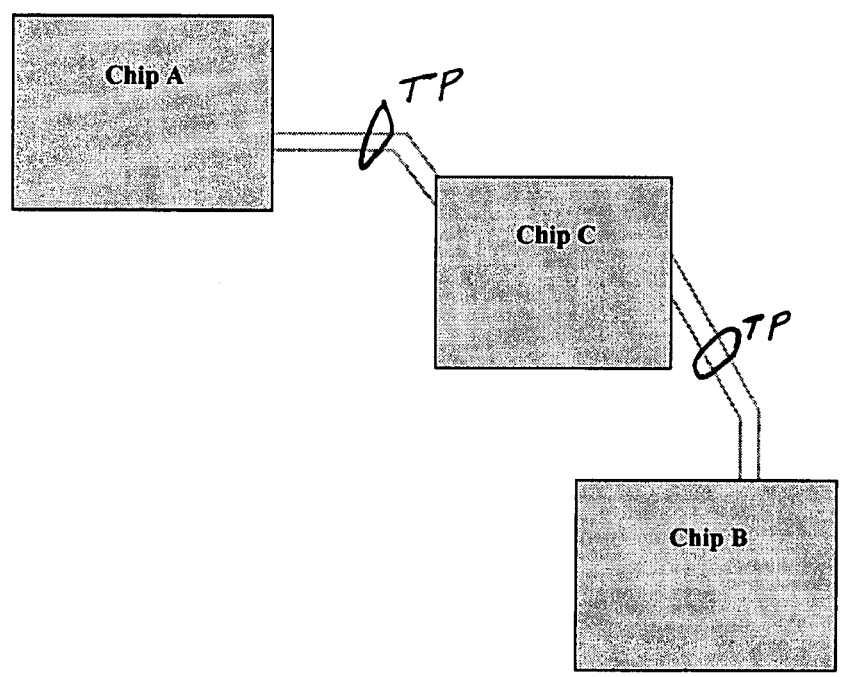
FIG. 8 shows chip A and B are connected by one or more transmission pairs which must pass under chip C without actually connecting to Chip C.

FIGS. 7 and 8 show the use of the invention to accommodate the passing of a transmission pair through a BGA pin field from two unassociated integrated circuit (IC) chips as shown in FIG. 8. That is, chip A and chip B are connected to one or more transmission pairs TP which must pass under chip C without actually connecting to chip C.

ADVANTAGES

1. Simple, cost-effective and low risk solution requiring only board layout changes to solve a manufacturability problem.
2. widely applicable to high performance electronic systems in telecom and other fields.

Thus, there has been disclosed a novel method and apparatus for through-hole via positioning which is incorporated in a layout tool for use by circuit board manufacturers, particularly by their design shops.

The invention includes a method and resulting PCB product directed to routing two or more traces through a regularly spaced grid of through-hole vias on a printed circuit board. The characterizing feature of the invention is that it provides a larger additional available routing space for conductive traces between rows or columns of vias in the grid which are increased by translating the position of one or both of the adjacent rows or columns along an axis of the grid. The invention could also be incorporated in a computer aided design (CAD) tool for automating the performance of the method according to the invention and optimize the resulting routability. In addition, there is novelty in the printed circuit board having this feature (i.e. non-regularly spaced grid of through-hole vias) resulting from the method defined above.

While the invention has been described in relation to preferred embodiments of the invention, it will be appreciated that other embodiments, adaptations and modifications of the invention will be apparent to those skilled in the art.

What is claimed is:

1. A method for providing enlarged spacing between rows of vias in a ball grid array (BGA) multilayered printed wiring board land pattern in which the lands in said pattern are connected to said vias by a link connector comprising:
rotating, elongating, and/or truncating selected consecutive link connectors and rotating their respective corresponding vias in a row or column or selected consecutive rows or columns to achieve said enlarged spacing between rows or columns of vias in said BGA land pattern.

2. The method defined in claim 1 wherein at least two consecutive rows or columns of link connectors and their respective vias are rotated, elongated and/or truncated in mutually opposite directions.

3. A method defined in claim 1 whereby the rotating, elongating and/or truncating is performed in a manner to achieve a wider circuit trace routing channel between adjacent rows or columns of vias.

4. The method defined in claim 1 wherein unusable fractions of routing channels are transferred to a given channel, such that the cumulative sum of said fractions become a usable additional routing channel.

5. A BGA substrate or printed wiring board in which via and link connector pattern has been modified in accordance with the method described in claim 1.

6. A computer for automating the application of the method defined in claim 1 during layout so as to optimize the resulting routability.

* * * * *